United States Patent [19]
Bitko et al.

[11] Patent Number: 5,994,161
[45] Date of Patent: Nov. 30, 1999

[54] TEMPERATURE COEFFICIENT OF OFFSET ADJUSTED SEMICONDUCTOR DEVICE AND METHOD THEREOF

[75] Inventors: Gordon D. Bitko, Phoenix; Andrew C. McNeil, Scottsdale; David J. Monk, Mesa, all of Ariz.

[73] Assignee: Motorola, Inc., Schaumburg, Ill.

[21] Appl. No.: 08/927,150

[22] Filed: Sep. 3, 1997

[51] Int. Cl.⁶ .................................................. H01L 21/00
[52] U.S. Cl. .............................. 438/53; 438/50; 73/720; 73/726
[58] Field of Search .................. 438/50, 51, 53; 73/719, 720, 725, 726

[56] References Cited

U.S. PATENT DOCUMENTS

| | | | |
|---|---|---|---|
| 4,442,717 | 4/1984 | Kurtz et al. | 73/766 |
| 4,703,658 | 11/1987 | Mrozack, Jr. et al. | 73/724 |
| 4,889,590 | 12/1989 | Tucker et al. | 438/53 |
| 4,926,674 | 5/1990 | Fossum et al. | 73/4 R |
| 5,264,075 | 11/1993 | Zanini-Fisher et al. | 438/53 |
| 5,323,051 | 6/1994 | Adams et al. | 257/417 |
| 5,454,270 | 10/1995 | Brown et al. | 73/720 |
| 5,585,311 | 12/1996 | Ko | 438/53 |
| 5,591,679 | 1/1997 | Jakobsen et al. | 438/51 |
| 5,600,071 | 2/1997 | Sooriakumar et al. | 73/721 |
| 5,888,412 | 3/1999 | Sooriakumar et al. | 438/759 |
| 5,889,211 | 3/1999 | Maudie et al. | 73/720 |

*Primary Examiner*—Kevin M. Picardat
*Attorney, Agent, or Firm*—George C. Chen; Sharon K. Coleman

[57] ABSTRACT

A non-zero temperature coefficient of offset (Tco) in a semiconductor device (5) is adjusted by reducing the amount of adhesive material used to secure a first structure to a second structure. An adhesive layer (14) used to secure a sensor die (11) to a constraint die (12) in a pressure sensor application is reduced in thickness and/or formed so that adhesive material does not completely cover the constraint die (12). The Tco is further adjusted by reducing the amount and/or patterning the adhesive layer (18) used to secure the sensor (10) to its package (16).

21 Claims, 2 Drawing Sheets

TEMPERATURE COEFFICIENT OF OFFSET ADJUSTED SEMICONDUCTOR DEVICE AND METHOD THEREOF

BACKGROUND OF THE INVENTION

The present invention relates, generally, to semiconductor devices and, more particularly, to thermal stresses affecting semiconductor devices.

Micro-Electrical-Mechanical-Systems (MEMS) such as sensors are widely used in applications such as automotive, household appliances, building ventilation, and in general industrial applications to sense a physical condition such as pressure, temperature, or acceleration, and to provide an electrical signal representative of the sensed physical condition. A conventional pressure sensor is constructed as a network of resistors in a resistive bridge configuration, wherein the resistive bridge has two terminals for coupling to power supply potentials and two terminals for providing a differential output signal. In pressure sensor applications, the bridge resistors are formed on a sensing diaphragm by implanting or diffusing impurity materials into a semiconductor substrate. When the sensor is exposed to the physical condition, one or more of the bridge resistors changes resistance, thereby unbalancing the resistive bridge and generating a differential output signal. As those skilled in the art are aware, the electrical signal is proportional to the imbalance of the resistor network.

A drawback of resistive bridge type sensors is that they produce a non-zero output electrical signal (i.e., offset voltage) at their output terminals with a null input applied. This non-zero offset electrical signal in response to the null input also varies from sensor to sensor due to process and manufacturing variations. It should be noted that a sensor is at a null state when the null input of the physical condition is applied, i.e., when the pressure on one side of the sensing diaphragm is equal to the pressure on an opposing side of the sensing diaphragm. Further, the output signal of these types of pressure sensors varies over the operating pressure range at a specified supply voltage. The change in the output signal over the operating pressure range also varies from sensor to sensor due to process and manufacturing variations. In addition, the offset parameter is sensitive to temperature in these types of sensors. Definitions of terms commonly used by those skilled in sensor art can be found in the second edition of the data book entitled "PRESSURE SENSOR DEVICE DATA" copyrighted in 1994 by Motorola, Inc.

Temperature coefficient of offset (Tco) is a measure of non-pressure induced stresses as a function of temperature that are placed on a semiconductor device such as a MEMS device and is expressed in microvolts per degree Celsius ($\mu V/° C.$). A large Tco makes it difficult to design over temperature. Thus, for ease of design using MEMS, inaccuracies, such as Tco, are preferably near zero. In practice, however, the Tco is typically not sufficiently near zero, thus requiring compensation to reduce the Tco to near zero.

One commonly used technique for calibrating and temperature compensating offset is to provide an offset resistor network that is laser trimmed. Drawbacks of this technique are that laser trimming each sensor is an irreversible process that is costly and increases the amount of time for manufacturing a sensor, i.e., increases cycle time.

While some techniques compensate for Tco, they are not directed at a specific cause. A specific cause of a high or undesirable, e.g. nonzero, Tco has not been identified. Accordingly, it would be advantageous to identify a cause or factor affecting the temperature coefficient of offset and to have a method and mechanism for adjusting that factor to decrease or adjust the Tco of a MEMS. It would be of further advantage for the Tco-adjusted MEMS to be manufacturable using common sensor manufacturing techniques.

BRIEF DESCRIPTION OF THE DRAWINGS

The present invention will be hereinafter described wherein like numerals denote like elements or steps.

DETAILED DESCRIPTION OF THE DRAWINGS

Generally, the present invention provides a method for adjusting the temperature coefficient of offset of a semiconductor device. Through experimentation, the present inventors have identified a factor that affects the temperature dependent parameters of a semiconductor device and particularly, the Tco of a MEMS device. Thermal stress on the semiconductor device was found to be, in part, due to an adhesive material used to secure the semiconductor die, such as a sensor die, to an adjacent surface, such as a constraint die. Particularly, the Tco was found to be affected in large part by the amount of adhesive or the thickness of the adhesive layer used to secure the two surfaces to each other. This is the result of a mismatch in the coefficient of thermal expansion (CTE) between the surfaces, for example, between the adhesive material and the semiconductor material. The present invention provides a method for reducing the amount of adhesive material to adjust the Tco of the semiconductor device and further provides a method for patterning the adhesive layer to adjust the Tco in a positive or negative direction.

More particularly, the present invention provides a method for adjusting the Tco of a MEMS device. In accordance with one aspect of the invention, the Tco is adjusted by altering the amount or the mass of an adhesive layer used to secure a MEMS die to a constraint die. In accordance with another aspect of the invention, the Tco is adjusted by altering the mass of an adhesive layer used to secure the MEMS device to its packaging.

A Tco-adjusted semiconductor device in accordance with the present invention comprises a MEMS die secured to a mounting surface via an adhesive layer. In accordance with the present invention, the mass of the adhesive layer is reduced by patterning and/or varying the thickness of the adhesive material forming the adhesive layer.

Figure 1:
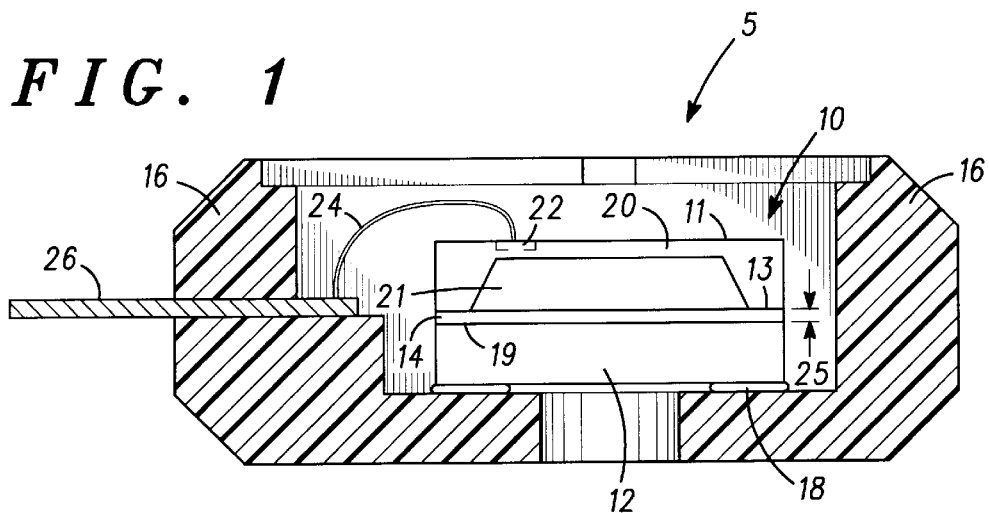
FIG. 1 is a cross-sectional view of a semiconductor device in accordance with the present invention.

Referring now to FIG. 1, a partial cross-sectional view of a semiconductor device 5 in accordance with the present invention is shown. Semiconductor device 5 comprises a MEMS device 10, an adhesive layer 18, and a package or chip carrier device 16. MEMS device 10 is suitably secured to package 16 via adhesive layer 18. By way of example, semiconductor device 5 shown in FIG. 1 is an absolute pressure sensor. Semiconductor device 5 further includes lead frame 26 integral with package 16 and a bonding wire 24 coupling MEMS device 10 to leadframe 26. Although only one lead of leadframe 26 and only one bonding wire 24 is shown in FIG. 1, it should be understood that multiple leads and bonding wires can be and commonly are used to perform the task.

MEMS device 10 comprises a MEMS die 11, for example a sensor die, secured to a semiconductor base substrate 12, such as a constraint die, via adhesive layer 14. MEMS die 11 and base 12 each comprise a semiconductor material, e.g., silicon, gallium arsenide, or the like. MEMS die 11 includes a mounting surface 13 and a diaphragm 20 formed within a second or sensing surface of MEMS die 11. More particularly, MEMS die 11 is preferably silicon with diaphragm 20 formed within the second surface by a micro-machining or a silicon etching process into a square pattern approximately 10 micrometers ($\mu$m) to 35 $\mu$m thick. The micro-machining or silicon etching process forms a cavity 21 in MEMS die 11 bounded by diaphragm 20. As should be understood, MEMS die 11 and diaphragm 20 are an integral device. Further, although cavity 21 is shown with tapered walls, straight walls can be formed using well known techniques.

MEMS device 10 further includes a transducer 22 formed in diaphragm 20. Transducer 22 is typically formed at a side of diaphragm 20 by implanting or diffusing impurity materials into diaphragm 20. By way of example, transducer 22 may comprise a piezoresistive element that provides an output signal when pressure is applied to diaphragm 20. In other words, transducer 22 converts the flexing of MEMS die 11, or more particularly, the flexing of diaphragm 20, into an electrical signal representative of the pressure being sensed. Bonding wire 24 is used to interconnect transducer 22 to leadframe 26 thereby channeling the electrical signal to the exterior of package 16 and semiconductor device 5.

Adhesive layer 14 is disposed between sensor die 11 and constraint die 12 securing each to the other. More particularly, adhesive layer 14 is disposed between mounting surface 13 of sensor die 11 and a major surface 19 of constraint die 12. In known absolute pressure sensor applications, an adhesive layer having a thickness of approximately 20 $\mu$m to 25 $\mu$m and fully covering major surface 19 is used to secure the sensor die to its constraint layer. With continued reference to FIG. 1, to adjust the Tco and in accordance with one aspect of the invention, adhesive layer 14 has a thickness 25 less than approximately 20 $\mu$m and preferably a thickness 25 of approximately 8 $\mu$m to 15 $\mu$m. It should be appreciated that in accordance with the present invention, thickness 25 is modified to achieve a desired Tco. Thickness 25 necessary to achieve a desired Tco may vary from lot to lot, wafer to wafer, or even die to die based on the particular die's proximity to the center of the wafer.

To adjust the Tco and in accordance with another aspect of the present invention, adhesive layer 14 is formed on less than the entirety of major surface 19 or in other words, major surface 19 is not completely covered with adhesive material, thereby forming a pattern. The present inventors have found that particular patterns may be used to control the Tco. Some of such patterns are depicted in FIGS. 2–5.

FIGS. 2–5 illustrate a top view of various adhesive layers patterned in accordance with the present invention. For ease of understanding and description, the general location transducer 22 in relation to the particular pattern has been superimposed on adhesive layer 14 and is shown by a dashed box. It is to be understood that transducer 22 is formed in diaphragm 20 and thus is elevated from adhesive layer 14.

Figure 2:
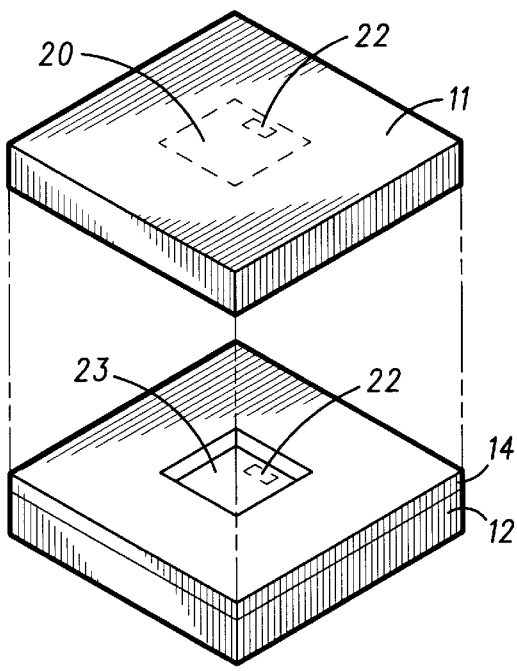
FIG. 2 is an exploded isometric view of an adhesion layer of the semiconductor device of FIG. 1 in accordance with a first embodiment of the present invention.

Referring first to FIG. 2, in accordance with one embodiment of the present invention, adhesive layer 14 is patterned so that the adhesive material is located about the periphery or edges of major surface 19 of constraint die 12 forming an aperture 23 having a generally square shape in adhesive layer 14. Square aperture 14 generally conforms to the area below diaphragm 20. In other words, the surface area of major surface 19 falling below diaphragm 20 is free of adhesive material. In accordance with this embodiment, transducer 22 is located, generally, above a side of square aperture 23.

Figure 4:
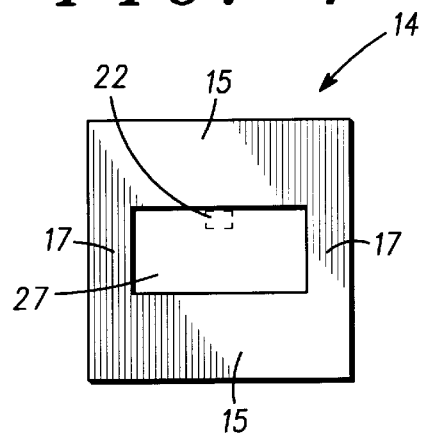
FIG. 4 is a top view of an adhesion layer of the semiconductor device of FIG. 1 in accordance with a third embodiment of the present invention.
Figure 3:
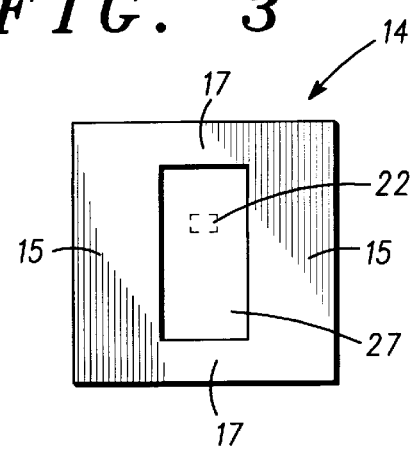
FIG. 3 is a top view of an adhesion layer of the semiconductor device of FIG. 1 in accordance with a second embodiment of the present invention.

Referring to FIG. 3 and FIG. 4, adhesive layer 14 can be patterned so that adhesive material is located about the periphery or edges of the major surface of constraint die 12 forming an aperture 27 having a generally rectangular shape in adhesive layer 14. Adhesive layer 14, in accordance with this aspect, comprises two portions 15 and two portions 17 such that portions 15 are wide in relation to portions 17 and portions 17 are narrow in relation to portions 15. Wide portions 15 (or wide sides) and narrow portions 17 (or narrow sides) form boundaries of aperture 27 and give aperture 27 its generally rectangular shape.

Referring specifically to FIG. 3, in accordance with a second embodiment, transducer 22 is located, generally, above and equidistant between wide portions 15. In other words, transducer 22 is located, generally, above and closer to one portion of narrow portions 17 than to the other portion of narrow portions 17.

Referring specifically to FIG. 4, in accordance with a third embodiment, transducer 22 is located, generally, above and equidistant between narrow portions 17. In other words, transducer 22 is located, generally above and closer to one portion of wide portions 15 than to the other portion of wide portion 15.

As discussed herein, in accordance with the present invention, thickness 25 of adhesive layer 14 may be reduced to adjust the Tco. By reducing thickness 25 of and/or patterning adhesive layer 14, the amount or mass of adhesive layer 14 is reduced. Through experimentation which included Finite Element Analysis (FEA) modeling and wafer experiments, the present inventors found that reducing the amount of adhesive material adjusted the Tco. For example, adhesive layer 14 typically is formed to a thickness 25 of approximately 20 micrometers (m) to 25 $\mu$m. By reducing thickness 25 approximately 50%, the present inventors found that the Tco decreased by approximately 50%.

The present inventors further determined that by patterning the adhesive material (i.e. forming adhesive layer 14 into a particular pattern), the value of the Tco could be controlled, i.e., increased or decreased. For example, using the pattern depicted in FIG. 2 in an absolute pressure sensor decreased the mean Tco to approximately 4 $\mu$V/° C. to 5 $\mu$V/° C. compared to approximately 16 $\mu$V/° C. to 17 $\mu$V/° C. for an absolute pressure sensor having an adhesive layer approximately 20 to 25 $\mu$m thick completely covering the constraint die as is common procedure.

Figure 6:
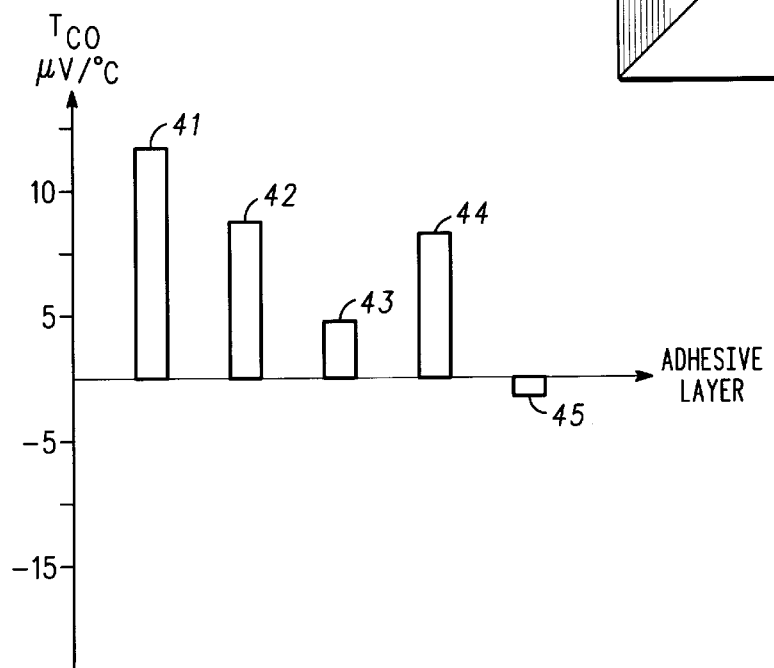
FIG. 6 is a graphical comparison of Tco's for a semiconductor device in accordance with the present invention as estimated with finite element mechanical modeling.

For exemplary purposes, FIG. 6 provides a graphical comparison of typical resultant Tco's for a semiconductor device having an adhesive layer 14 in accordance with the present invention, as estimated with finite element mechanical modeling. The Tco values are distributed along the abscissa or Y-axis and the various patterns along the ordinate or X-axis of the graph. Using known techniques in which an adhesive layer having a thickness 25 of approximately 20 μm to 25 μm is formed over the entire major surface 19 produces a Tco of approximately 17 μV/° C., as illustrated by bar 41. In accordance with the present invention, reducing thickness 25 of adhesive layer 14 to approximately 10 μm produces a Tco of approximately 12 μV/° C., as illustrated by bar 42. The Tco can be further reduced by patterning the approximately 10 μm thick layer as discussed herein in reference to FIG. 2. Forming an approximately 10 μm thick adhesive layer in a pattern as discussed in reference to FIG. 2 produces a Tco of approximately 5 μV/° C., as illustrated by bar 43.

Alternatively, the Tco can be altered by patterning adhesive layer 14 as described herein in reference to FIG. 3. For example, forming a pattern as discussed in reference FIG. 3 to a thickness 25 of approximately 10 μm produces a Tco of approximately 12 μV/° C., as illustrated by bar 44.

The importance or significance of the placement of transducer 22 in relation to the particularities of the pattern is highlighted by comparing bar 44 and bar 45. Bar 45 depicts a Tco of approximately −2 μV/° C. representative of a semiconductor device having an adhesive layer patterned as discussed in reference to FIG. 4 and a thickness 25 of approximately 10 μm. As discussed and can be seen by reference to and comparison of FIG. 3 and FIG. 4, adhesive layer 14 is patterned so that transducer 22 is located, generally, equidistant between each portion of wide portions 15 (FIG. 3) or so that transducer 22 is located, generally, equidistant between each portion of narrow portions 17 (FIG. 4). As shown in FIG. 6, patterning adhesive layer 14 so that transducer 22 is located, generally, closer to one portion of wide portions 15 than the other portion of wide portions 15 (FIG. 4) results in a smaller magnitude Tco than if transducer 22 is located, generally, closer to one portion of narrow portions 17 than the other portion of narrow portions 17 (FIG. 3).

Figure 5:
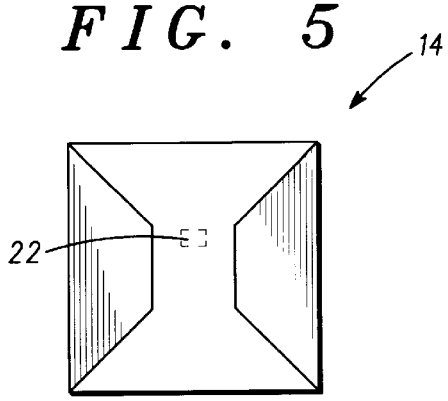
FIG. 5 is a top view of an adhesion layer of the semiconductor device of FIG. 1 in accordance with a principle of the present invention.

As can be seen, by comparison of FIGS. 2–4 and bars 41–43 of FIG. 6, thickness 25 of adhesive layer 14 and the location of adhesive material in relation to transducer 22 affect the Tco. These principles of the present invention are further highlighted by reference to FIG. 5 in conjunction with FIG. 3. Minimizing narrow portions 17 (reference FIG. 3) alters the Tco. Through FEA modeling using an adhesive layer 14 thickness 25 of 10 μm, the present inventors found that minimizing narrow portions 17 to zero produced a negative Tco. More particularly, simulating a pattern such as that illustrated in FIG. 5, produced a Tco of approximately −11 μV/° C. However, as those skilled the art will appreciate, in practice narrow portions 17 of adhesive layer 14 could not be minimized to zero without sacrificing the hermetic seal necessary for a differential or absolute pressure sensor to properly function. Nonetheless, this demonstrates a principle of the present invention that the Tco is altered by how and where adhesive material of adhesive layer 14 is located in relation to transducer 22. Moreover, a pattern such as that depicted in FIG. 5 is applicable to applications not requiring the adhesive to provide a hermetic seal.

Adhesive layer 14 can be formed from any material or bonding agent suitable for adhering MEMS die 11 to constraint die 12. In accordance with present invention, adhesive layer 14 comprises a silicon-to-silicon adhesive material. For example, adhesive layer 14 may comprise glass frit, silver glass, silver epoxy, or the like.

In accordance with a preferred embodiment, adhesive layer 14 comprises glass frit. Adhesive layer 14 can suitably be formed using, for example, a silk screen method in which the silk screen is patterned with the desired pattern for adhesive layer 14. By way of example, a slurry comprising a mixture of glass powder, filler, and organic binder is deposited through the silk screen. The combination is fired by heating to a sufficiently high temperature to burn out the organic binder. Selection and use of the binder as well as the subsequent firing comprise methods well known in the art of glass frit deposition. As is also known by those skilled in the art, thickness 25 of the glass frit may be controlled by the wire density of the screen. For example, a screen mesh having a wire density of 325 wires per inch may be chosen over a screen mesh having a wire density of 200 wires per inch to form a "thinner" adhesive layer.

The patterning of adhesive layer 14 is preferably performed at the wafer level, prior to dicing of the wafer to form individual semiconductor die. In practice, the particular pattern and thickness 25 of adhesive layer 14 necessary to achieve a desired Tco for a particular lot or wafer may be determined via FEA modeling and/or through test wafers. By altering the amount of material used in one, some, or all adhesive layers (via varying the thickness and/or patterning of the material), the present invention provides a method for controlling the Tco using common manufacturing techniques.

Figure 7:
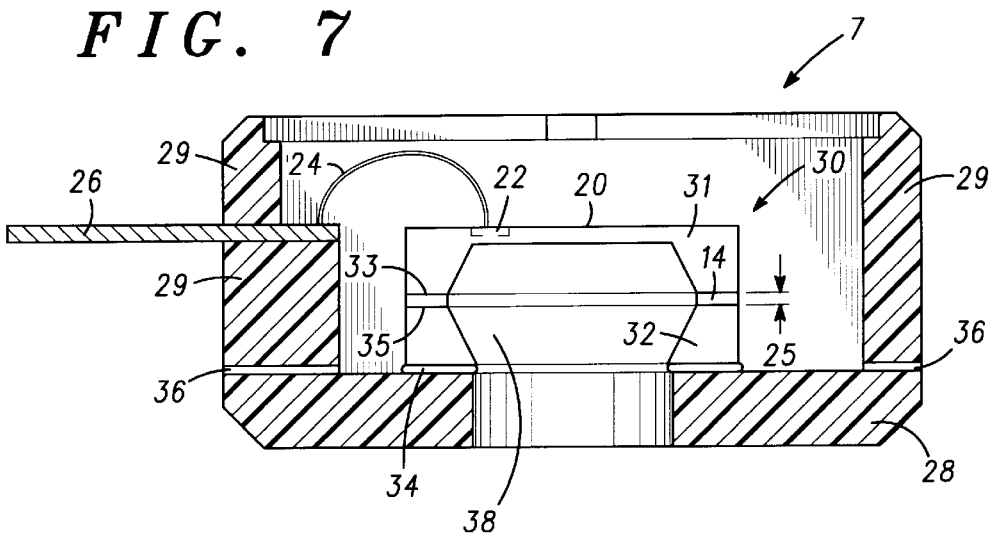
FIG. 7 is a cross-sectional view of another semiconductor device in accordance with the present invention.

Referring now to FIG. 7, a partial cross-sectional view of a semiconductor device in accordance with another aspect of the present invention is shown. Semiconductor device 7 comprises a MEMS device 30, a package having a base 28 and sidewalls 29, and an adhesive layer 34 securing MEMS device 30 to base 28. Semiconductor device 7 shown in FIG. 7 is a differential pressure sensor. Semiconductor device 7 further includes lead frame 26 integral with the package and a bonding wire 24 coupling MEMS device 30 to leadframe 26.

MEMS device 30 is comprised of a semiconductor material, e.g., silicon, gallium arsenide, or the like. In accordance with this aspect of the invention, base 28 is a ceramic material such as alumina or other material preferably having a coefficient of thermal expansion similar to that of the semiconductor material of MEMS device 30 and/or sidewalls 29. Sidewalls 29 are typically formed of a thermoset material such as epoxy or thermoplastic material such as polyphenylene sulfide (PPS). Base 28 and sidewalls 29 are secured to each other via a ceramic-to-epoxy (or ceramic-to-thermoplastic) adhesive layer 36. Similarly, adhesive layer 34 is formed from an adhesive material suitable for bonding MEMS device 30 to base 28. For example, where MEMS device 30 comprises silicon, adhesive layer 34 is formed from a silicon-to-ceramic adhesive material.

MEMS device 30 comprises a sensor die 31 secured to a base die 32 via an adhesive layer 14. MEMS device 30 includes a cavity 38 extending from base die 32 into sensor die 31, terminating to form diaphragm 20. Techniques for forming cavity 38 are well known. While cavity 38 is shown having tapered sidewalls, optionally, cavity 38 can be formed having straight sidewalls using well known techniques.

As discussed with respect to semiconductor device 5 of FIG. 1, adhesive layer 14 is formed of a silicon-to-silicon adhesive and is preferably a glass frit. In accordance with the present invention, adhesive layer 14 of semiconductor device 7 is patterned as discussed in reference to semiconductor device 5 to similarly reduce the Tco of semiconductor device 7.

In accordance with a further aspect of the present invention, adhesive layer 34 can be patterned to further reduce the Tco of semiconductor device 7. Adhesive layer 34 can be patterned in accordance with the patterns discussed in relation to adhesive layer 14 and in reference to FIGS. 2, 3, and 4.

Referring back to FIG. 1, adhesive layer 18 used to secure MEMS device 10 to package 16 can be patterned as described herein in reference to adhesive layer 34 to further adjust the Tco of semiconductor device 5. For example, adhesive layer 18 may be patterned in accordance with the pattern of FIG. 2, FIG. 3, or FIG. 4. Optionally, the thickness of adhesive layer 18 may be reduced to adjust the Tco either in conjunction with patterning adhesive layer 18 or alone. Package 16 is typically formed of a thermoset material such as epoxy or thermoplastic material such as PPS. Accordingly, adhesive layer 18 comprises a silicon-to-epoxy or siliconto-thermoplastic adhesive or bonding material.

Because of the cost associated with compensating for a non-zero Tco, many manufacturers produce "uncompensated" devices and either do not specify a Tco or specify a Tco over a broad range, for example $-30 \mu V/°$ C. to $+30 \mu V/°$ C. The present invention provides a method for adjusting the Tco without requiring costly and time consuming compensation schemes. Of course, known compensation schemes could be used in conjunction with the present invention to fine tune the Tco if desired.

More particularly, in large scale manufacturing operations, the throughput of each processing step involved with the formation of a semiconductor device must be as efficient as possible. Compensating for the Tco via known techniques such as laser trimming is cumbersome, costly, and requires considerable time and effort; all of which significantly affect the throughput of the manufacturing operation. Adjusting the Tco by reducing the thickness and/or patterning the adhesive layers, in accordance with the present invention, eliminates the need for time consuming laser trimming and the costly equipment associated therewith. The present invention further controls cost by modifying techniques or process steps currently used in the sensor manufacturing operations to adjust a non-zero Tco. Moreover, the method of adjusting for a non-zero Tco provided by the present invention reduces the throughput time of the manufacturing operation, thus further decreasing the total cost associated with the manufacturing operation.

By now it should be appreciated that the method for adjusting the Tco in a MEMS device and a Tco-adjusted MEMS device has been provided. Although the present invention has been presented in the context of absolute and differential pressure sensors, those skilled in the art will appreciate that the present invention is applicable to other devices. Moreover, although specific adhesive layer patterns have been presented herein, the present invention is not limited to those specific patterns but includes patterning in accordance with the principles of the invention as discussed and claimed herein.

We claim:

1. A method for adjusting a non-zero temperature coefficient of offset in a sensor having a sensor die, a base die having a mounting surface, and an adhesive layer securing the sensor die to the mounting surface of the base die, the method comprising the step of:

forming the adhesive layer on the mounting surface of the base die to a thickness less than 20 micrometers.

2. The method of claim 1 further comprising the step of forming the adhesive layer to a thickness of approximately 8 $\mu$m to 15 $\mu$m.

3. The method of claim 1 further comprising the step of forming the adhesive layer in a pattern so that the adhesive layer covers less than an entirety of the mounting surface of the base die.

4. A semiconductor device, comprising:

a base substrate having a first major surface and a second major surface opposite the first major surface;

a semiconductor die having a mounting surface, a sensing surface, a cavity extending from the mounting surface into the semiconductor die to form a diaphragm in the sensing surface, and a transducer formed on the diaphragm; and an adhesive layer disposed between the first major surface and the mounting surface and having a thickness of less than 20 micrometers ($\mu$m), wherein the adhesive layer secures the semiconductor die to the base substrate and adjusts for a non-zero temperature coefficient of offset (Tco).

5. The semiconductor device of claim 4 wherein the adhesive layer has a thickness of 8 $\mu$m to 15 $\mu$m.

6. The semiconductor device of claim 4 wherein the adhesive layer covers less than an entirety of the first major surface of the base substrate.

7. The semiconductor device of claim 4 wherein the adhesive layer is disposed about a periphery of the first major surface so that a square aperture is formed in the adhesive layer.

8. The semiconductor device of claim 4 wherein the adhesive layer is disposed about a periphery of the base substrate so that a rectangular aperture is formed in the adhesive layer bounded by narrow portions and wide portions.

9. The semiconductor device of claim 8 wherein rectangular aperture is formed so that the transducer is disposed closer to a first portion of the narrow portions than to a second portion of the narrow portions.

10. The semiconductor device of claim 8 wherein the rectangular aperture is formed so that the transducer is disposed closer to a first portion of the wide portions than to a second portion of the wide portions.

11. The semiconductor device of claim 4, wherein the adhesive layer is comprised of one of a glass frit, silver epoxy, or silver glass material.

12. The semiconductor device of claim 4, wherein the semiconductor device is a pressure sensor.

13. The semiconductor device of claim 12, wherein the pressure sensor is an absolute pressure sensor.

14. The semiconductor device of claim 12, wherein the pressure sensor is an asymmetric sensor.

15. A temperature coefficient of offset (Tco) adjusted semiconductor device, comprising:

a base substrate having a first major surface and a second major surface opposite the first major surface;

a semiconductor die having a mounting surface and a sensing surface;

a first patterned adhesive layer disposed between the first major surface and the mounting surface to secure the semiconductor die to the base substrate and adjust the Tco;

a cavity extending from the second major surface towards the sensing surface to form a diaphragm in the sensing surface; and a transducer formed on the diaphragm.

16. The Tco-adjusted semiconductor device of claim 15 further comprising:

a package having a base and sidewalls; and a second patterned adhesive layer disposed between the base and the second major surface and covering less than an entirety of the second major surface, wherein the second patterned adhesive layer secures the base substrate to the package.

17. The Tco-adjusted semiconductor device of claim 16 wherein the base comprises a ceramic material and the second patterned adhesive layer comprises a silicon-to-ceramic bonding agent.

18. The Tco-adjusted semiconductor device of claim 15 wherein the first patterned adhesive layer has a thickness of less than approximately 20 micrometers.

19. An absolute pressure sensor, comprising:

a constraint die having a first major surface and a second major surface opposite the first major surface;

a sensor die having a mounting surface, a sensing surface, a cavity extending from the mounting surface to form a diaphragm in the sensing surface, and a transducer formed on the diaphragm; and an adhesive layer disposed between the first major surface and the mounting surface and covering less than an entirety of the first major surface, wherein the adhesive layer adjusts for a non-zero temperature coefficient of offset (Tco), secures the sensor die to the constraint die, and forms a hermetic seal.

20. The absolute pressure sensor of claim 19 wherein the adhesive layer has a thickness of less than approximately 20 micrometers.

21. The absolute pressure sensor of claim 20 wherein the adhesive layer comprises a one of a glass frit, silver glass, or silver epoxy material.

* * * * *